(12) United States Patent
Costello

(10) Patent No.: US 7,621,754 B2
(45) Date of Patent: Nov. 24, 2009

(54) GUIDE MODULE SYSTEM WITH INSERTION DETECTOR

(75) Inventor: Brian Patrick Costello, Scotts Valley, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 25 days.

(21) Appl. No.: 12/110,580

(22) Filed: Apr. 28, 2008

(65) Prior Publication Data

US 2009/0269947 A1    Oct. 29, 2009

(51) Int. Cl.
*H01R 12/00* (2006.01)
(52) U.S. Cl. ............................ 439/65; 439/489; 439/378
(58) Field of Classification Search .................. 439/64, 439/65, 79, 378, 488, 489, 717
See application file for complete search history.

(56) References Cited

U.S. PATENT DOCUMENTS 4,820,169 A * 4/1989 Weber et al. .................. 439/65
6,632,107 B1 * 10/2003 Vanbesien .................... 439/65
6,997,736 B2 * 2/2006 Costello et al. ............. 439/378
7,186,121 B1 * 3/2007 Costello et al. ............... 439/79

\* cited by examiner

*Primary Examiner*—Tho D Ta

(57) ABSTRACT

A guide module system detects when electrical components are mated with one another. The guide module system includes a guide pin and a guide module. The guide pin is configured to be mounted to a first electrical component. At least a portion of the guide pin includes a conductive material. The guide module is configured to be mounted to a second electrical component. The guide module includes a channel that is positioned to receive the guide pin when the first electrical component is mated with the second electrical component. The guide module includes first and second electrical contacts within the channel. The first and second electrical contacts and the conductive material in the guide pin form a closed circuit when the guide pin is inserted into the guide receptacle.

20 Claims, 7 Drawing Sheets

GUIDE MODULE SYSTEM WITH INSERTION DETECTOR

BACKGROUND OF THE INVENTION

The subject matter herein generally relates to connector guide modules and, more particularly, to backplane connector guide modules.

Backplane connector guide modules are used to mate two electrical components together. For example, backplane connector guide modules may be used to mechanically guide and align two components when the components are mated. These guide modules include a guide pin and a receptacle. The guide pin is mounted on one component and the receptacle is mounted on the other component. The two components are aligned with respect to one another by inserting the guide pin into the receptacle. The receptacle aligns to the guide pin as the components are mated.

However, existing guide pins and receptacles do not provide an indication or electrical signal when the guide pin is fully inserted into the receptacle. Instead, several electrical pins are used. For example, one of the two components includes several pins. These pins are inserted into the other component when the two components are mated. These pins may be signal or power pins, for example. A signal pin is a pin configured to communicate a data signal. A power pin is a pin configured to supply power to another device.

These pins typically are used to provide an electric signal when the two components are fully mated. For example, when a first component is mated with a second component, the pins that are connected to the first component communicate a signal or power to the second component. The two components are fully mated if the signal or power communicated from these pins is received by the second component. The two components are not fully mated if the signal or power communicated from these pins is not received by the second component. In this way, the two components can determine if the components are fully mated.

Using existing signal and power pins to detect the mating of two components reduces the total number of available pins used for communicating data signals or power between the two components. Typically, the total number of pins on one of the components is fixed. Using these pins to detect the mating of the components reduces the number of pins that may be used to communicate a data signal or power. Moreover, these pins may be bent and otherwise damaged during the mating of the two components. When the pins are bent or damaged, the pins may not be able to communicate a signal or power. When the pins are unable to communicate the signal or power, the two components may not be able to determine that the two components are fully mated.

Thus, a need exists for an assembly that provides mechanical guidance to two components being mated with one another and confirmation when the two components are mated. Moreover, a need exists for such an assembly that does not reduce the number of pins that are used to communicate data signals or power from one component to the other.

BRIEF DESCRIPTION OF THE INVENTION

In one embodiment, a guide module system to detect when electrical components are mated with one another includes a guide pin and a guide module. The guide pin is configured to be mounted to a first electrical component. At least a portion of the guide pin includes a conductive material. The guide module is configured to be mounted to a second electrical component. The guide module includes a channel that is positioned to receive the guide pin when the first electrical component is mated with the second electrical component. The guide module includes first and second electrical contacts within the channel. The first and second electrical contacts and the conductive material in the guide pin form a closed circuit when the guide pin is inserted into the guide receptacle.

In another embodiment, a guide module for a guide module system is configured to detect when first and second electrical components are mated with one another. The guide module includes a first section and a second section. The first section is configured to be mounted on the first electrical component. The first section includes a first electrical contact and a channel. The first electrical contact is configured to be electrically connected with the first electrical component. The channel is configured to receive a guide pin mounted on the second electrical component. The second section is configured to be mounted on the first electrical component. The second section includes a second electrical contact and is electrically isolated from the first electrical component. The second electrical contact is configured to be electrically connected to a source of electric current. The first and second electrical contacts form a closed circuit with the guide pin when the guide pin is inserted into the channel.

In another embodiment, a guide module system includes a guide pin, a guide module, and first and second electrical contacts. The guide pin is configured to be mounted to a first electrical component. The guide module is configured to be mounted on a second electrical component. The first electrical contact is configured to be connected to a source of electric current and is located in the guide module. The second electrical contact is located in the guide module and forms a closed circuit with the first electrical contact and the guide pin when the guide pin is inserted into the guide module.

DETAILED DESCRIPTION OF THE INVENTION

Figure 1:
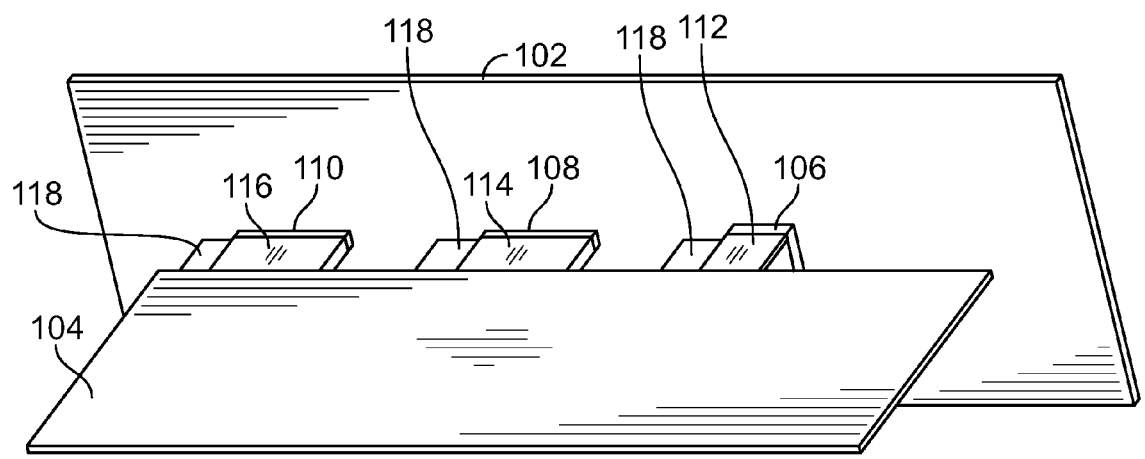
FIG. 1 is a perspective view of a guide module system including a backplane board connected to a daughter board according to one embodiment.

FIG. 1 is a perspective view of a guide module system 100 including a backplane board 102 connected to a daughter board 104 according to one embodiment. The guide module system 100 detects when electrical components are mated with one another. The backplane board 102 and the daughter board 104 are examples of electrical components. For example, in the illustrated embodiment, the backplane and daughter boards 102, 104 may be circuit boards. However, each of the backplane and daughter boards 102, 104 may be an electrical component other than a circuit board.

By way of example only, each of the backplane and daughter boards 102, 104 includes a plurality of electrical connectors. These electrical connectors may communicate power or data signals between one another. The electrical connectors include a power connector 106 and signal connectors 108, 110. The power connector 106 is mated with a power connector 112 on the daughter board 104. The signal connectors 108, 110 are mated with signal connectors 114, 116 on the daughter board 104. Additionally, the daughter board 104 includes guide modules 118 that receive guide pins 130 (shown in FIG. 3).

The backplane board 102 and daughter board 104 are shown orthogonal to one another in FIG. 1. In another embodiment, however, the backplane board 102 and daughter board 104 are parallel to each other. In such an embodiment, the guide pins 130 are mounted so that the elongated bodies 140 (shown in FIG. 4) of the guide pins 130 are parallel to the backplane board 102.

Figure 2:
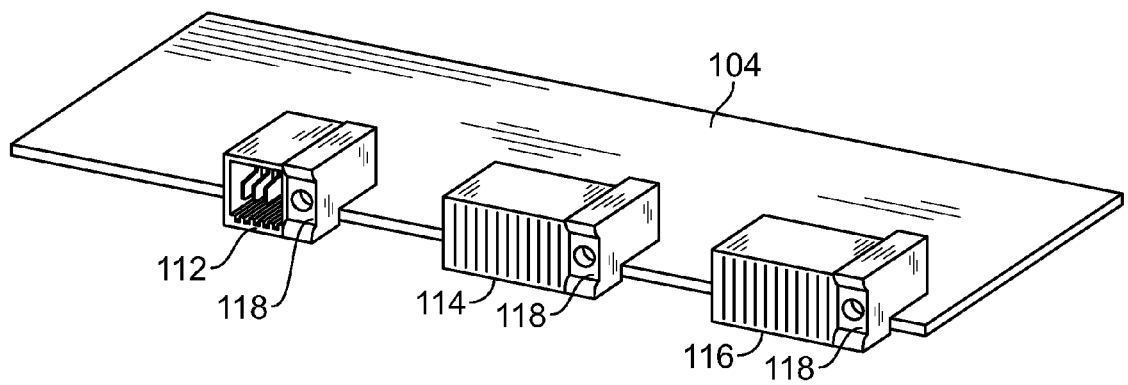
FIG. 2 is a perspective view of the daughter board of FIG. 1.

FIG. 2 is a perspective view of the daughter board 104 of FIG. 1. As shown in FIG. 2, each of the power connector 112 and signal connectors 114, 116 may be placed adjacent to one of the guide modules 118.

Figure 3:
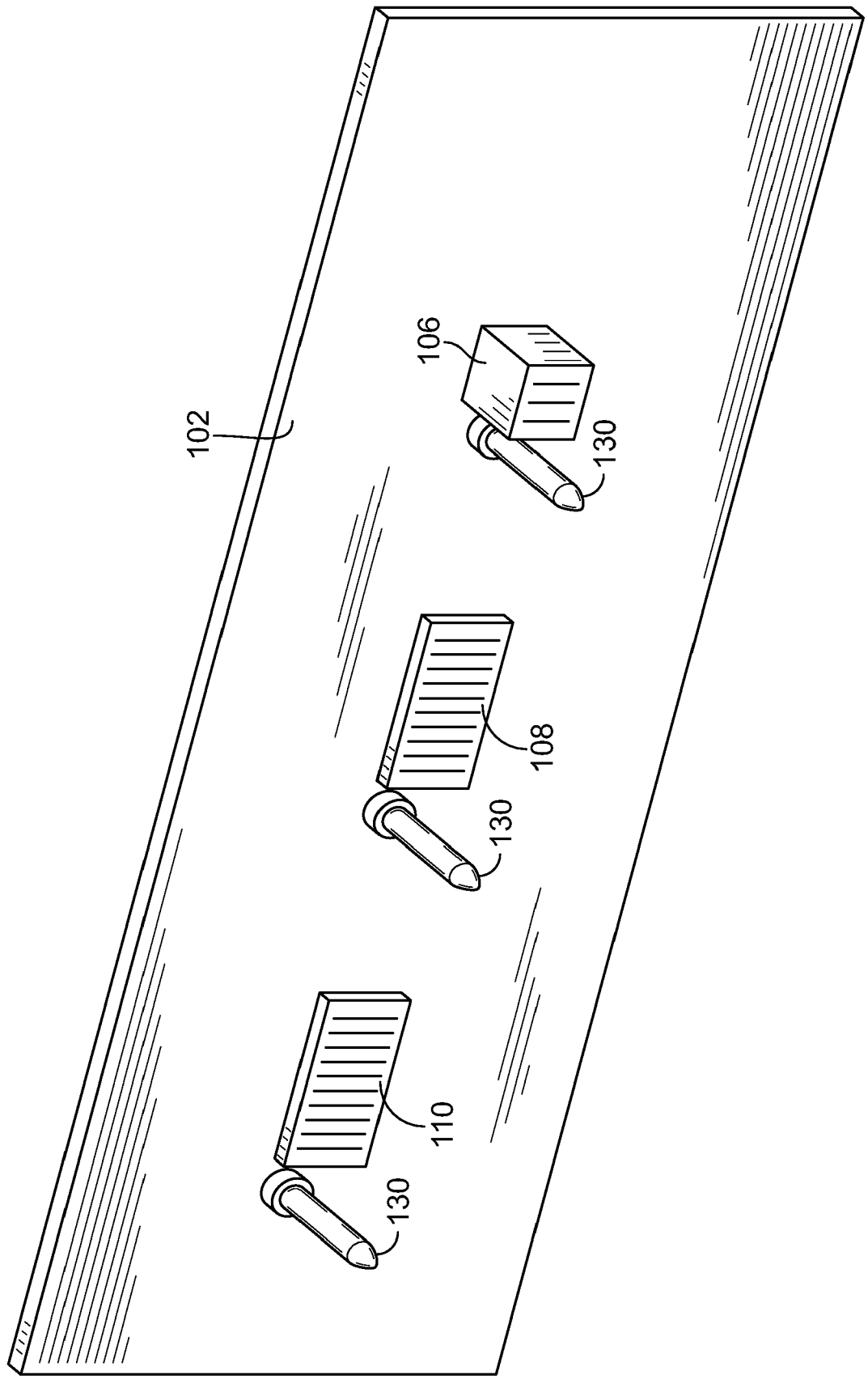
FIG. 3 is a perspective view of the backplane board of FIG. 1.

FIG. 3 is a perspective view of the backplane board 102 of FIG. 1. The backplane board 102 includes several guide pins 130 that extend outward from the backplane board 102. The guide pins 130 are inserted into the guide modules 118 of the daughter board 104.

The guide modules 118 and guide pins 130 position and align both the daughter board 104 and the backplane board 102. For example, the guide modules 118 facilitate the establishment of perpendicularity between the daughter board 104 and the backplane board 102. The guide modules 118 also facilitate lateral positioning of the connections between the signal connectors 108, 110 with the signal connectors 114, 116 and between the power connector 106 with the power connector 112.

In operation, the guide pins 130 are inserted into the guide modules 118 to mate the backplane board 102 with the daughter board 104. A circuit is formed when one of the guide pins 130 is inserted into a corresponding guide module 118. The circuit includes the guide pin 130 and one or more electrical contacts in the guide module 118. The circuit is closed when the guide pin 130 is inserted into the guide module 118. When the circuit is closed, a device connected to the daughter board 104 may determine that the daughter board 104 and the backplane board 102 are fully mated. The circuit is open when the guide pin 130 is not inserted into the guide module 118 or when the guide pin 130 is not fully inserted into the guide module 118. When the circuit is open, the device connected to the daughter board 104 or the backplane board 102 may determine that the daughter and backplane boards 104, 102 are not fully mated. The device is any device capable of determining that the circuit is open or closed. The device may notify a user when the circuit is open or closed by illuminating a light, for example.

Figure 4:
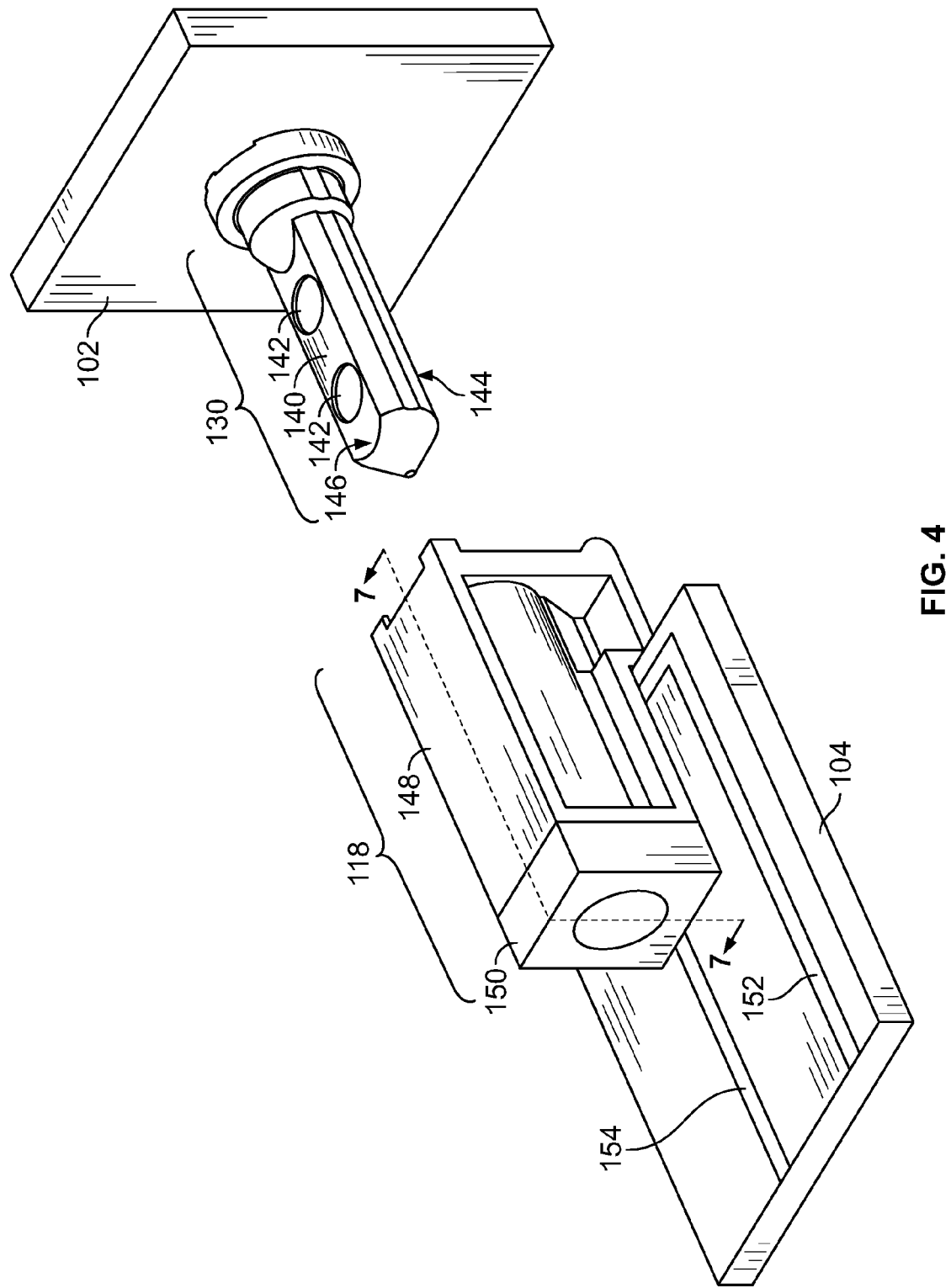
FIG. 4 is a perspective view of the guide module and guide pin of FIGS. 2 and 3.

FIG. 4 is a perspective view of the guide module 118 and guide pin 130 of FIGS. 2 and 3. The guide pin 130 has an elongated body 140 that is entirely or partially formed from a conductive material. For example, the guide pin 130 may have a non-conductive body 140 with a conductive surface provided along a bottom surface 144 of the body 140 of the guide pin 130. In another example, the guide pin 130 has a conductive body 140 that is partially coated with a non-conductive material.

The guide pin 130 may include one or more indentations 142. In the illustrated embodiment, the indentations 142 are provided on a top surface 146 of the guide pin 130. Alternatively, the indentations 142 are provided on the bottom surface 144 of the body 140. In another embodiment, the guide pin 130 does not include any of the indentations 142 on either the top or bottom surfaces 146, 144.

In one embodiment, the guide pin 130 is mounted on the backplane board 102 so that the guide pin 130 is electrically isolated from the backplane board 102. For example, the guide pin 130 is mounted on the backplane board 102 so that no conductive pathways or traces in the backplane board 102 supply power or data signals to the guide pin 130. Alternatively, the guide pin 130 is mounted on the backplane board 102 so that the guide pin 130 is connected to a load or electrical ground of the backplane board 102. For example, the guide pin 130 may be connected to a conductive trace in the backplane board 102. This conductive trace may be terminated to a device that determines when a circuit is closed. The circuit may include the guide pin 130 and one or more of front and rear electrical contacts 192, 202 in the guide module 118 (shown in FIGS. 5 through 7). In another embodiment, the guide pin 130 is mounted on the backplane board 102 so that the guide pin 130 is connected to a source of electric current. For example, the guide pin 130 may be connected to a conductive trace in the backplane board 102. This conductive trace may be terminated to a source of electric current.

In one embodiment, the guide module 118 has an elongated body that is divided into a loading section 148 and an insulating section 150. The loading section 148 is connected to a load trace 152 of the daughter board 104. For example, the load trace 152 may be terminated to the loading section 148. The load trace 152 is a conductive pathway in the daughter board 104. The load trace 152 connects the loading section 148 to a load or to an electrical ground of the daughter board 104. For example, the load trace 152 may connect the loading section 148 to a device that determines when the circuit that includes the guide pin 130 is closed. Alternatively, the guide module 118 has a single elongated body that is not divided into sections.

The rear electrical contact 202 (shown in FIGS. 5 through 7) in the insulating section 150 of the guide module 118 is connected to a source trace 154 of the daughter board 104. The source trace 154 connects the insulating section 150 with a source or supply of electrical current or voltage.

The guide pin 130 closes a circuit when the guide pin 130 is inserted into the guide module 118. The circuit connects the source trace 154 with the load trace 152. Electric current may travel from the source trace 154 to the load trace 152 when the guide pin 130 is inserted into the guide module 118 and the circuit is closed. The circuit is open when the guide pin 130 is removed from the guide module 118. Electrical current may not travel from the source trace 154 to the load trace 152 when the guide pin 130 is removed from the guide module 118 and the circuit is open.

In another embodiment, the guide pin 130 closes a circuit that connects the source trace 154 in the daughter board 104 with a conductive trace in the backplane board 102. The conductive trace may terminate to a load or electrical ground of the backplane board 102. Electric current may travel from the source trace 154 to the load or electrical ground of the backplane board 102 through the guide pin 130. A device connected to the conductive trace in the backplane board 102 may detect when current is flowing through the circuit when the guide pin 130 is inserted into the guide module 118.

In another embodiment, the guide pin 130 closes a circuit that supplies power or electric current to the daughter board 104 when the guide pin 130 is inserted into the guide module 118. The guide pin 130 may be connected to a conductive trace in the backplane board 102. This conductive trace may be terminated to source of current. One or both of the front and rear electrical contacts 192, 202 of the guide module 118 (shown in FIGS. 5-7) may be connected to one or more conductive traces in the daughter board 104. One or more of these conductive traces may be terminated to an electrical ground or load. For example, one or more of these conductive traces may be terminated to a device that determines when electric current is supplied to the front or rear electrical contact 192, 202. The guide pin 130 contacts the front and/or rear electrical contacts 192, 202 when the guide pin 130 is inserted into the guide module 118. The guide pin 130 supplies electric current to the front and/or rear electrical contacts 192, 202 when the guide pin 130 is inserted into the guide module 118. A device connected to the front and/or rear electrical contacts 192, 202 may determine when current is supplied to one or both of the front and rear electrical contacts 192, 202. When current is supplied to the front and rear electrical contacts 192, 202, the device determines that the guide pin 130 is inserted into the guide module 118.

Figure 5:
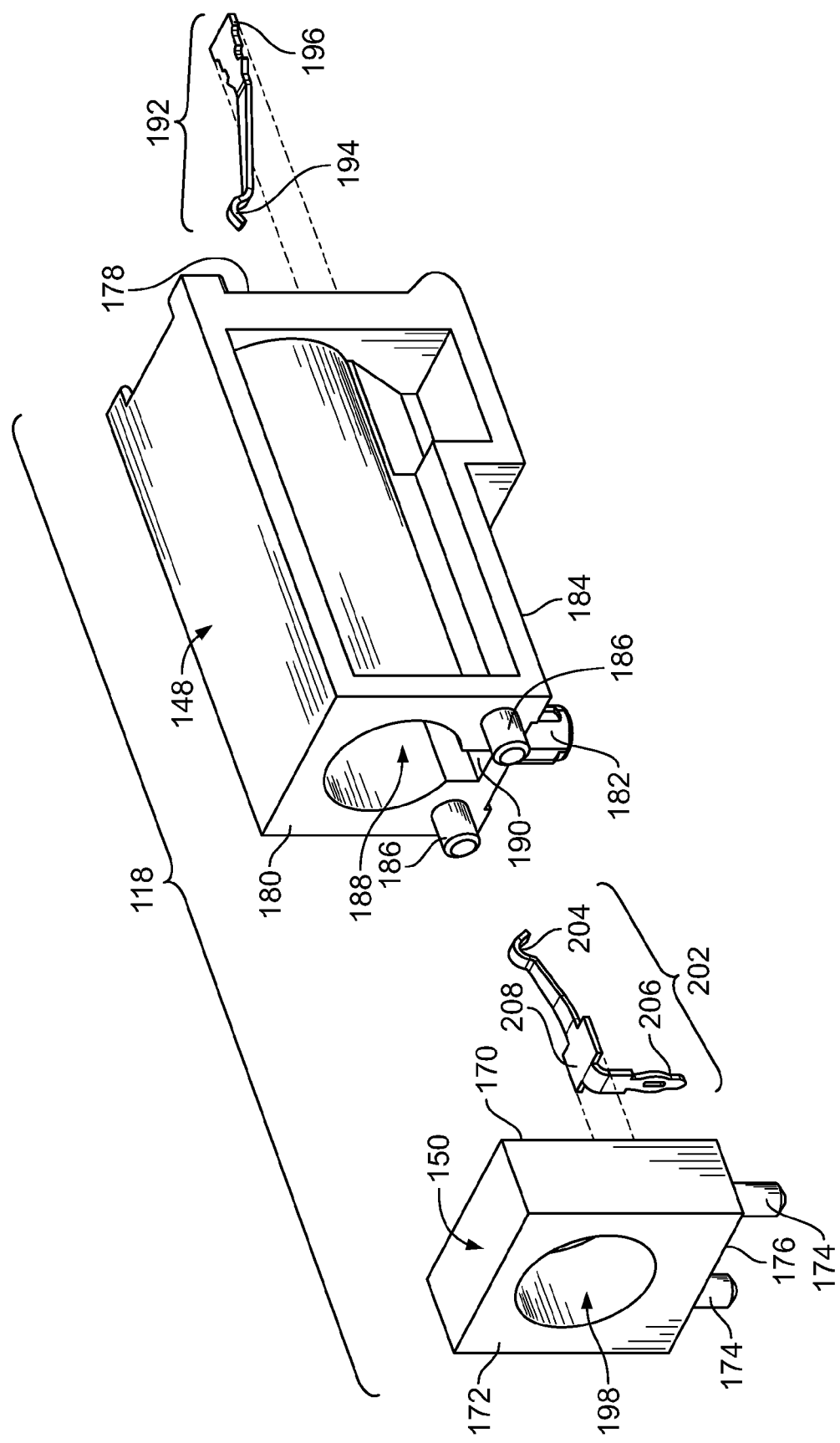
FIG. 5 is an exploded rear perspective view of the guide module of FIG. 4.

FIG. 5 is an exploded rear perspective view of the guide module 118 of FIG. 4. The loading section 148 may be fabricated from, or coated with, a conductive material. For example, the loading section 148 may be formed of a die cast metal. Alternatively, the loading section 148 may be formed of a nonconductive material. For example, the loading section 148 may be formed from a plastic material. The loading section 148 has an elongated shape that extends between a front end 178 and a back end 180. The loading section 148 may include an insertion pin 182 extending downward from a bottom side 184. The insertion pin 182 is positioned to be inserted into a corresponding hole (not shown) in the daughter board 104 to mount the loading section 148 to the daughter board 104. In one embodiment, the insertion pin 182 is conducting to electrically connect the loading section 148 with the load trace 152 (shown in FIG. 4) of the daughter board 104.

The loading section 148 also includes a bore 220 (shown in FIG. 7) that extends upwards into the loading section 148 from the bottom side 184 of the guide module 118. In one embodiment, the bore 220 is a female threaded bore. The bore 220 engages a retention pin 222 (shown in FIG. 9) located in or attached to the daughter board 104. In one embodiment, the retention pin 222 is a male threaded connection that engages with the bore 220 to secure the loading section 148 to the daughter board 104.

A pair of pins 186 project from the back end 180 of the loading section 148. The pins 186 align and secure the loading section 148 with the insulating section 150. The pins 186 are positioned to be inserted into corresponding holes 210 (shown in FIG. 6) in the insulating section 150 to align and secure the loading section 148 with the insulating section 150.

The loading section 148 includes a channel 188 extending at least partially therethrough between the front and back ends 178, 180 of the loading section 148. The channel 188 receives the guide pin 130 (shown in FIG. 4) when the guide pin 130 is inserted into the guide module 118. In the illustrated embodiment, the channel 188 extends entirely between the front and back ends 178, 180.

The loading section 148 also includes a slot 190 extending at least partially therethrough between the front and back ends 178, 180. The slot 190 receives a front electrical contact 192. The front electrical contact 192 is at least partially or entirely formed from a conductive material. For example, the front electrical contact 192 may be formed from a conductive material or from a nonconductive material with at least a portion of the front electrical contact 192 covered with a conductive material. The front electrical contact 192 includes a contact end 194 and a mounting end 196. The front electrical contact 192 may be placed in the slot 190 by sliding the mounting end 196 along the slot 190 until the front electrical contact 192 is located within the loading section 148. The contact end 194 extends up into the channel 188 when the front electrical contact 192 is placed into the loading section 148. While the front electrical contact 192 has an elongated shape in the illustrated embodiment, the front electrical contact 192 may have a different shape. For example, the front electrical contact 192 may have a circular, or ring, shape. The ring shape of the front electrical contact 192 may be posited along the outside of the channel 188, for example.

The insulating section 150 may be fabricated from, or coated with, a nonconductive material. For example, the insulating section 150 may be formed from a plastic material. The insulating section 150 has a front end 170 that opposes a back end 172. The front end 170 of the insulating section 150 may engage the back end 180 of the loading section 148 to form the guide module 118.

Each of a pair of insertion pins 174 extends downward from a bottom side 176 of the insulating section 150. The insertion pins 174 may be inserted into corresponding holes (not shown) in the daughter board 104 (shown in FIG. 4) to mount the insulating section 150 to the daughter board 104.

An opening 198 extends at least partially between the front and back ends 170, 172 of the insulating section 150. In the illustrated embodiment, the opening 178 extends from the front end 170 to the back end 172. In an alternative embodiment, the insulating section 150 does not include the opening 198.

The insulating section 150 includes a slot 200 (shown in FIG. 6) extending at least partially therethrough between the front end 170 and the back end 172. In the illustrated embodiment, the slot 200 does not extend entirely through the insulating section 150 from the front end 170 to the back end 172. The slot 200 receives a rear electrical contact 202. The rear electrical contact 202 is at least partially or entirely formed from a conductive material. For example, the rear electrical contact 202 may be formed from a conductive material or from a nonconductive material with at least a portion of the rear electrical contact 202 covered with a conductive material. The rear electrical contact 202 includes a contact end 204, a tail 206 and a mounting plate 208 therebetween. While the rear electrical contact 202 has an elongated shape in the illustrated embodiment, the rear electrical contact 202 may have a different shape. For example, the rear electrical contact 202 may have a circular, or ring, shape. The ring shape of the rear electrical contact 202 may be posited along the outside of the channel 188, for example.

The rear electrical contact 202 may be placed in the slot 200 by sliding the mounting plate 208 along the slot 200 until the rear electrical contact 202 is located within the insulating section 150. The contact end 204 extends up into the channel 188 of the loading section 148 when the rear electrical contact 202 is placed into the insulating section 150 and the front end 170 of the insulating section 150 engages the back end 180 of the loading section 148. The tail 206 may be inserted into the daughter board 104 when the insulating section 150 is mounted on the daughter board 104. The tail 206 may contact the source trace 154 (FIG. 4) of the daughter board 104 when the insulating section 150 is mounted oil the daughter board 104 and the tail 206 is inserted into the daughter board 104.

Figure 6:
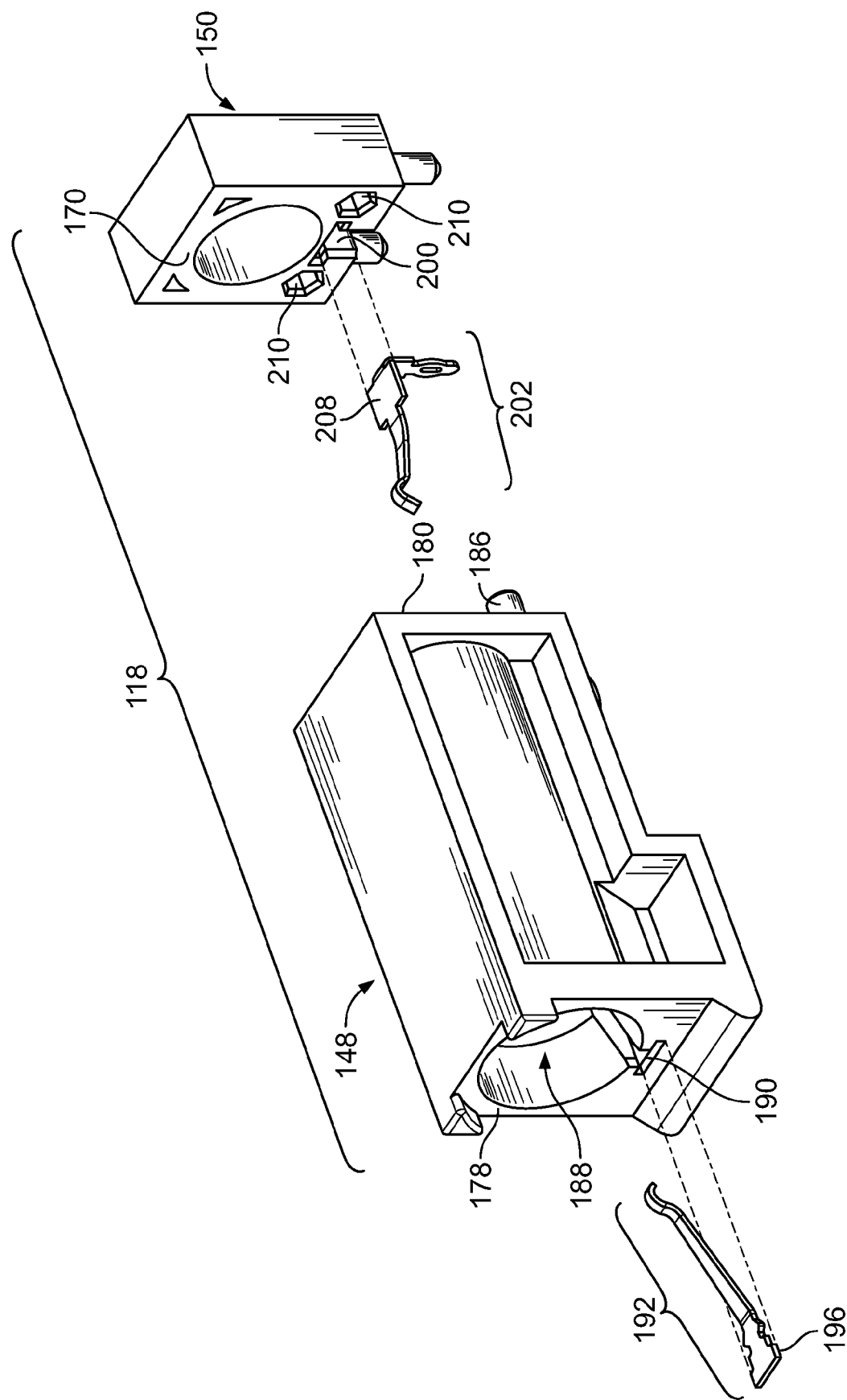
FIG. 6 is an exploded front perspective view of the guide module of FIGS. 4 and 5.

FIG. 6 is an exploded front perspective view of the guide module 118 of FIGS. 4 and 5. As shown in FIG. 6, the slot 190 in the loading section 148 is positioned to receive the mounting end 196 of the front electrical contact 192. The slot 200 in the insulating section 150 is positioned to receive the mounting plate 208 of the rear electrical contact 202.

The holes 210 in the front end 170 of the insulating section 150 are configured to receive the pins 186 extending from the back end 180 of the loading section 148. The pins 186 are inserted into the holes 210 to align and secure the insulating section 150 and the loading section 148 together.

Figure 7:
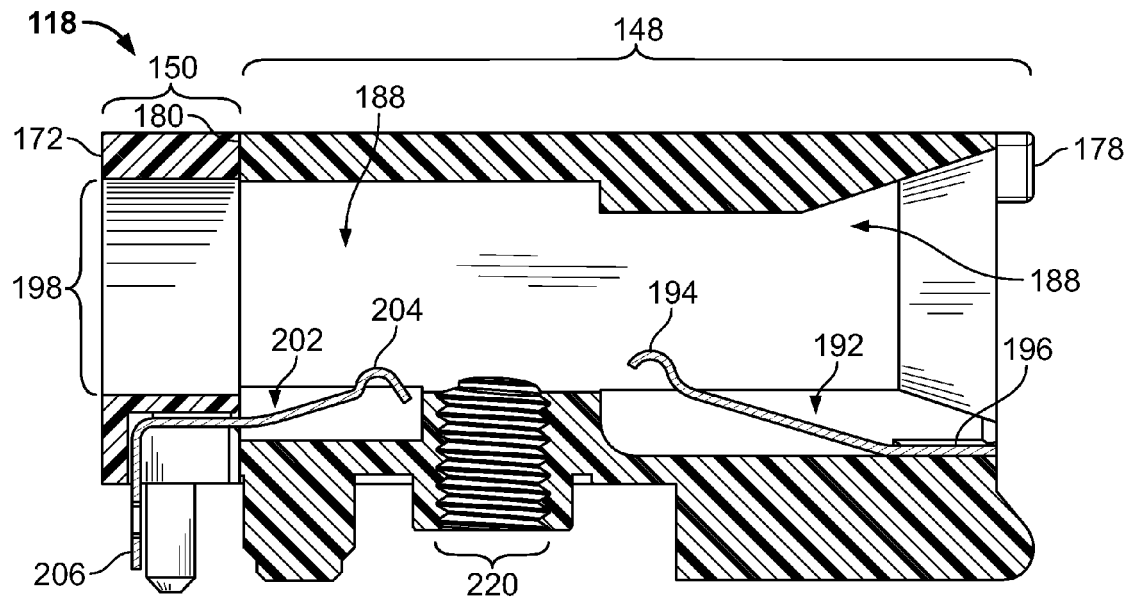
FIG. 7 is a cross-sectional view of the guide module of FIGS. 4 through 6 taken across line 4-4 in FIG. 4.

FIG. 7 is a cross-sectional view of the guide module 118 of FIGS. 4 through 6 taken across line 7-7 in FIG. 4. As shown in FIG. 7, the channel 188 and the opening 198 may form a continuous passageway that extends through the guide module 118 between the back end 172 of the insulating section 150 and the front end 178 of the loading section 148. Alternatively, the channel 188 may extend through the guide module 118 between the front end 178 and the back end 180 of the loading section 148, but the opening 198 may not extend entirely through the insulating section 150.

The contact ends 194, 204 of the front and rear electrical contacts 192, 202 extend partially upwards into the channel 188. The tail 206 of the rear electrical contact 202 is inserted into the daughter board 104 so that the tail 206 connects with the source trace 154 (shown in FIG. 4). The rear electrical contact 202 is electrically isolated from the loading section 148. As shown in FIG. 7, the rear electrical contact, 202 does not contact the loading section 148 in one embodiment. The front electrical contact 192 is placed in the loading section 148 so that the mounting end 196 of the front electrical contact 192 contacts the loading section 148.

As described above, a circuit that connects the source trace 154 with the load trace 152 (shown in FIG. 4) is open when the guide pin 130 (also shown in FIG. 4) is not inserted into the channel 188 of the guide module 118. When the circuit is open, an electric current cannot flow from the source trace 154 to the load trace 152.

Alternatively, a circuit that connects the source trace 154 with a conductive trace in the backplane board 102 is open when the guide pin 130 is not inserted into the channel 188 of the guide module 118, also as described above. When the circuit is open, electric current cannot flow from the source trace 154 to the conductive trace in the backplane board 102.

In another embodiment, a circuit that connects a conductive trace in the backplane board 102 with the source trace 154 and/or the load trace 152 is open when the guide pin 130 is not inserted into the channel 188 of the guide module 118, also as described above. When the circuit is open, electric current cannot flow from the conductive trace in the backplane board 102 to the source trace 154 and/or the load trace 152 in the daughter board 104.

Figure 8:
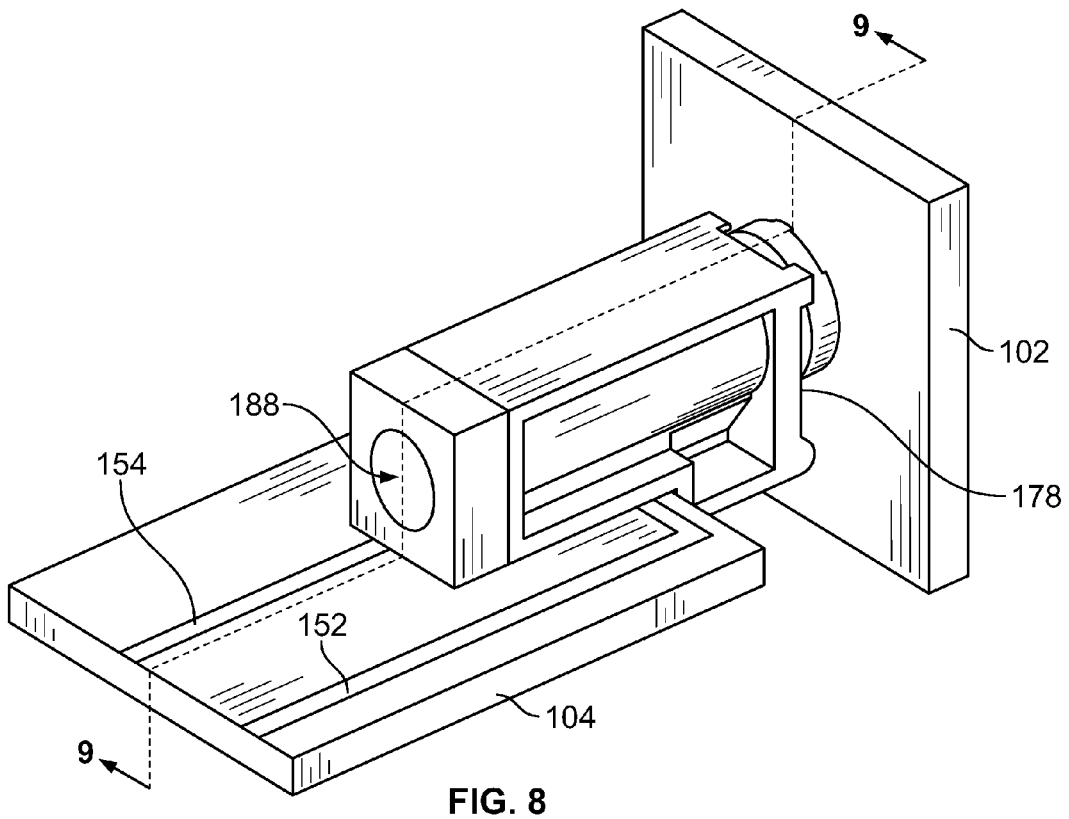
FIG. 8 is a perspective view of the guide pin inserted into the guide module of FIG. 4.

FIG. 8 is a perspective view of the guide pin 130 inserted into the guide module 118 of FIG. 4. The guide pin 130 is inserted into the channel 188 of the loading section 148 through the front end 178. The backplane board 102 mates with the daughter board 104 by inserting the guide pin 130 into the guide module 118. The circuit that connects the source trace 154 with the load trace 152 is closed when the guide pin 130 is inserted into the channel 188 of the guide module 118. When the circuit is closed, an electric current can flow from the source trace 154 to the load trace 152.

Figure 9:
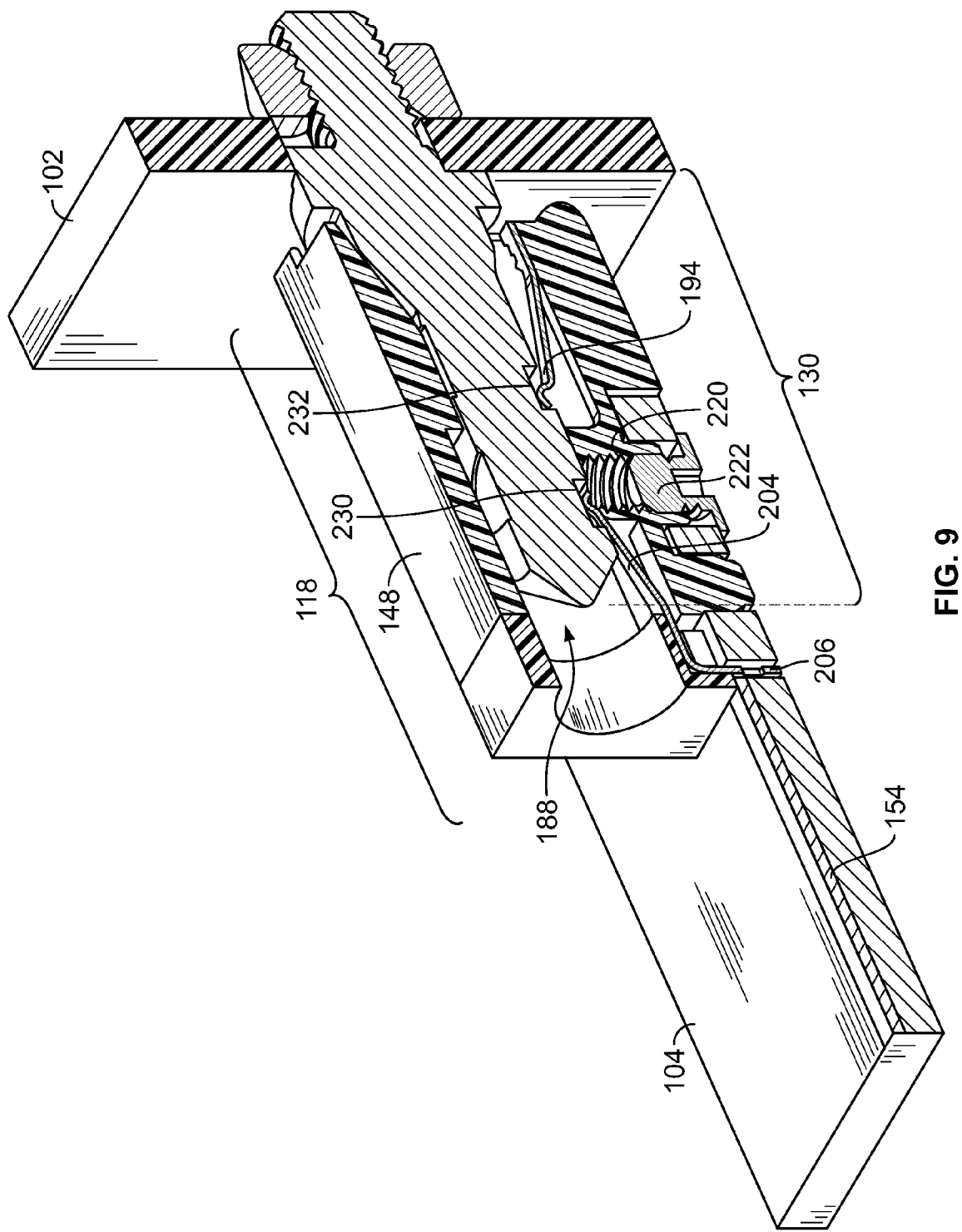
FIG. 9 is a cross-sectional view of the guide pin inserted into the guide module of FIG. 4 taken across line 8-8 of FIG. 8.

FIG. 9 is a cross-sectional view of the guide pin 130 inserted into the guide module 118 of FIG. 4 taken across line 9-9 of FIG. 8. As described above, the bore 220 in the loading section 148 engages the retention pin 222 in the daughter board 104 to secure the loading section 148 to the daughter board 104.

The guide pin 130 is inserted into the channel 188 of the guide module 118 and engages the contact ends 204, 194 of both of the rear and front electrical contacts 202, 192. The guide pin 130 may partially depress the contact ends 204, 194 of the rear and front electrical contacts 202, 192 when the guide pin 130 is inserted into the channel 188. In one embodiment, the guide pin 130 partially biases the front and rear electrical contacts 202, 192 as the guide pin 130 is inserted into the channel 188. The contact ends 204, 194 may partially release and move partially upwards into the indentations 142 on the bottom surface 144 of the body 140 of the guide pin 130 (shown in FIG. 4). The partial release and upward movement of the contact ends 204, 194 of the front and rear electrical contacts 202, 192 may provide a "click" when the contact ends 204, 194 engage the guide pin 130 in the area of the indentations 142 of the bottom surface 144 of the body 140.

The guide pin 130 electrically connects the rear and front electrical contacts 202, 192 when the guide pin 130 physically contacts the contact ends 204, 194 of the rear and front electrical contacts 202, 192. The guide pin 130 includes a conductive path that electrically connects the rear and front electrical contacts 202, 192. In one embodiment, the guide pin 130 includes or is formed from a conductive material. This conductive material provides the conductive path that electrically connects the rear and front electrical contacts 202, 192 when the guide pin 130 engages the contact ends 204, 194. In another embodiment, the guide pin 130 includes a conductive surface along at least a portion of the bottom side 144 of the guide pin 130. This conductive surface provides the conductive path that electrically connects the rear and front electrical contacts 202, 192 when the bottom side 144 engages the contact ends 204, 194 of the rear and front electrical contacts 202, 192. In another embodiment, at least a portion of the interior of the guide pin 130 includes or is formed from a conductive material while at least a portion of the outside of the guide pin 130 includes or is formed from a nonconductive material. One or more openings 230, 232 on the bottom side 144 of the guide pin 130 may expose the conductive material in the guide pin 130. The contact ends 204, 194 of the rear and front electrical contacts 202, 192 engage the conductive material in the guide pin 130 through the openings 230, 232. The conductive material in the interior of the guide pin 130 electrically connects the rear and front electrical contacts 202, 192 when the contact ends 204, 194 engage the conductive material through the openings 230, 232.

The circuit that includes the rear electrical contact 204, the guide pin 130 and the front electrical contact 194 is closed when the guide pin 130 is inserted into the channel 188 to mate the backplane and daughter boards 102, 104. The source trace 154 is electrically connected with the load trace 152 by the circuit when the circuit is closed. Electric current may flow from the source trace 154 to the load trace 152 when the circuit is closed. A device or load connected to the load trace 152 may detect when the circuit is closed and current flows from the source trace 154 to the load trace 152. The device or load may then notify a user or other device connected to either of the daughter and backplane boards 104, 102 when current flows from the source trace 154 to the load trace, 152. This notification may notify the user or device that the backplane board 102 is mated with the daughter board 104.

In another embodiment, the guide pin 130 closes a circuit that connects the source trace 154 in the daughter board 104 with a conductive trace in the backplane board 102. The conductive trace may terminate to a load or electrical ground of the backplane board 102. Electric current may travel from the source trace 154 to the load or electrical ground of the backplane board 102 through the guide pin 130. A device connected to the conductive trace in the backplane board 102 may detect when current is flowing through the circuit when the guide pin 130 is inserted into the guide module 118.

In another embodiment, the guide pin 130 closes a circuit that supplies power or electric current to the daughter board 104 when the guide pin 130 is inserted into the guide module 118. The guide pin 130 may be connected to a conductive trace in the backplane board 102. This conductive trace may be terminated to source of current. One or both of the front and rear electrical contacts 192, 202 of the guide module 118 (shown in FIGS. 5-7) may be connected to one or more conductive traces in the daughter board 104. These conductive traces may be terminated to loads or the electrical ground of the daughter board 104. For example, the source trace 154 and the load trace 152 may each be terminated to a load or electrical ground of the daughter board 104. The guide pin 130 supplies electric current to the front and/or rear electrical contacts 192, 202, when the guide pin 130 is inserted into the guide module 118. A device connected to the front and/or rear electrical contacts 192, 202 through the source and load traces 154, 152 may determine when current is supplied to one or both of the front and rear electrical contacts 192, 202. When current is supplied to the front and rear electrical contacts 192, 202, the device determines that the guide pin 130 is inserted into the guide module 118.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and merely are example embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A guide module system to detect when electrical components are mated with one another, the system comprising:
    a guide pin configured to be mounted to a first electrical component, at least a portion of the guide pin comprising a conductive material; and
    a guide module configured to be mounted to a second electrical component, the guide module having a channel therein that is positioned to receive the guide pin when the first electrical component is mated with the second electrical component, the guide module comprising first and second electrical contacts within the channel, the first and second electrical contacts and the conductive material in the guide pin forming a closed circuit when the guide pin is inserted into the guide module.

2. The guide module system according to claim 1, wherein the first electrical contact contacts a source of electric current.

3. The guide module system according to claim 1, wherein the guide pin is configured to be mounted to the first electrical component that also comprises a first electrical connector, the guide module is configured to be mounted to the second electrical component that also comprises a second electrical connector, the first and second electrical connectors being engaged with one another to communicate at least one of a power and a data signal when the guide pin is inserted into the guide module.

4. The guide module system according to claim 1, wherein the guide receptacle comprises a loading section and an insulating section, the guide pin being inserted into the guide module through the loading section, the insulating section electrically isolating the first electrical contact from the guide module.

5. The guide module system according to claim 1, wherein the second electrical contact is configured to electrically connect with a load, the load configured to determine when the closed circuit is formed.

6. The guide module system according to claim 1, wherein a contact end of each of the first and second electrical contacts at least partially extends into the channel, the contact ends of the first and second electrical contacts engaging the conductive material in the guide pin when the guide pin is inserted into the guide receptacle.

7. The guide module system according to claim 1, wherein the guide pin is electrically isolated from the first electrical component.

8. The guide module system according to claim 1, wherein at least a portion of an interior of the guide pin comprises the conductive material, the first and second electrical contacts engaging the conductive material to form the closed circuit through one or more openings in the guide pin.

9. The guide module system according to claim 1, wherein at least a portion of an outside surface of the guide pin comprises the conductive material.

10. A guide module for a guide module system configured to detect when first and second electrical components are mated with one another, the module comprising:
    a first section configured to be mounted on the first electrical component, the first section comprising a first electrical contact and a channel, the first electrical contact configured to be electrically connected with the first electrical component, the channel configured to receive a guide pin mounted on the second electrical component; and
    a second section configured to be mounted on the first electrical component, the second section comprising a second electrical contact, the second section being electrically isolated from the first electrical component, the second electrical contact configured to be electrically connected to a source of electric current, the first and second electrical contacts forming a closed circuit with the guide pin when the guide pin is inserted into the channel.

11. The guide module according to claim 10, wherein the first section is formed from a conductive material.

12. The guide module according to claim 10, wherein the second section is formed from a nonconductive material.

13. The guide module according to claim 10, further comprising a pin extending from an end of at least one of the first and second sections, the pin configured to be inserted into a hole in the other one of the first and section sections to secure the first and second sections together.

14. The guide module according to claim 10, wherein electric current flows from the second electrical contact to the first electrical contact when the guide pin is inserted into the channel.

15. The guide module according to claim 10, wherein each of the first and second electrical contacts at least partially extends into the channel.

16. A guide module system comprising:
- a guide pin configured to be mounted to a first electrical component;
- a guide module configured to be mounted on a second electrical component;
- a first electrical contact configured to be connected to a source of electric current, the first electrical contact being located in the guide module; and
- a second electrical contact located in the guide module, the second electrical contact forming a closed circuit with the first electrical contact and the guide pin when the guide pin is inserted into the guide module.

17. The guide module system according to claim 16, wherein the guide pin is configured to be electrically isolated from the first electrical component when mounted to the first electrical component.

18. The guide module system according to claim 16, wherein electric current flows from the first electrical contact to the second electrical contact when the guide pin is inserted into the guide module.

19. The guide module system according to claim 16, wherein the guide module comprises a channel configured to receive the guide pin and each of the first and second electrical contacts at least partially extends into the channel.

20. The guide module system according to claim 16, wherein the guide module comprises first and second sections, the first electrical contact located in the first section, the second electrical contact located in the second section, the first section comprising a nonconductive material, the second section comprising a conductive material.

\* \* \* \* \*